(12) United States Patent
Flake

(10) Patent No.: US 6,275,081 B1
(45) Date of Patent: Aug. 14, 2001

(54) GATED CLOCK FLIP-FLOPS

(75) Inventor: Lance Leslie Flake, Boulder, CO (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/325,013

(22) Filed: Jun. 2, 1999

(51) Int. Cl.[7] .................................................. H03K 3/289
(52) U.S. Cl. ............................................ 327/202; 327/207
(58) Field of Search ................................... 327/202, 203, 327/206, 207, 208, 216, 217, 225, 581; 714/707, 715, 724, 725, 726, 732, 733, 734

(56) References Cited

U.S. PATENT DOCUMENTS

| | | | |
|---|---|---|---|
| 4,862,068 | * 8/1989 | Kawashima et al. | 324/73 R |
| 5,155,393 | 10/1992 | Gongwer et al. | 327/218 |
| 5,323,400 | * 6/1994 | Agarwal et al. | 371/22.3 |
| 5,598,112 | 1/1997 | Phillips | 326/93 |
| 5,651,013 | * 7/1997 | Iadanza | 371/22.3 |
| 5,721,740 | 2/1998 | Moon et al. | 371/22.3 |
| 5,781,052 | * 7/1998 | Kleine | 327/208 |
| 5,790,439 | * 8/1998 | Yamanaka et al. | 364/724.13 |
| 5,799,048 | * 8/1998 | Farjad-Rad et al. | 327/157 |
| 5,838,693 | * 11/1998 | Morley | 371/22.31 |
| 5,896,396 | * 4/1999 | Sanghani et al. | 371/21.1 |
| 6,014,763 | * 1/2000 | Dhong et al. | 714/724 |

* cited by examiner

Primary Examiner—Timothy P. Callahan
Assistant Examiner—An T. Luu
(74) Attorney, Agent, or Firm—Martine & Penilla, LLP

(57) ABSTRACT

A gated scan flop circuit and methods of making the gated scan flop circuit are provided. In one example, the scan flop circuit includes a sub-scan flop circuit that incorporates a multiplexer and a flip flop circuit, and a data terminal D that is connected to the sub-scan flop circuit. Also provided is a first logic gate that is configured to receive a scan input terminal SI and a clock gate terminal G. The first logic gate has a first logic gate output that is connected to the sub-scan flop circuit. A scan enable terminal SE is connected to the sub-scan flip circuit, and a latch circuit is configured to receive the clock gate terminal G, and track its input while the clock terminal CLK is inactive. A second logic gate having a second logic gate output is provided that is configured to receive as inputs the scan enable terminal SE and the latched clock gate terminal G. A third logic gate is configured to receive a clock terminal CLK and the second logic gate output. The third logic gate has a third logic gate output that is connected to the sub-scan flop circuit. The gated scan flop circuit has an output Q and a complementary output /Q. In this example, the first logic gate, the latch circuit, the second logic gate, the third logic gate, and the sub-scan flop circuit are internally integrated circuit components of the scan flop circuit.

16 Claims, 2 Drawing Sheets

GATED CLOCK FLIP-FLOPS

BACKGROUND OF THE INVENTION

1. Field of the Invention

This invention relates generally to integrated circuits and more particularly concerns the use of integrated logic circuitry that can be implemented in the efficient testing of integrated circuit designs.

2. Description of the Related Art

Electronic devices, such as computer chips, can include thousands upon thousands of logic circuits. To ensure that the logic circuits are operating correctly before they are put to use, these circuits are tested to verify wiring and timing integrity. To facilitate this testing, during fabrication flip-flops are configured with multiplexers to form scan-flops. Usually, many scan flops are linked together throughout the IC design to form a chain of scan flops. A scan flop chain, therefore, will enable operation in both a test mode and a functional normal mode.

As is well known, there is often a need to have control over the clock signal that is communicated to the individual scan flops. To achieve this control, it is known to introduce some type of gating logic that is external to the individual scan flops. By introducing external clock gating logic, better control is provided as to when the scan flops change state. When a larger number of scan flops are used in a particular design, there is also a need to perform buffering on the clock lines. The buffering circuitry is generally designed to be well balanced such that all of the scan flops will still clock at about the same time. However, if both clock gating and clock buffering is desired, the clock line will have both clock gating and buffering circuitry.

To accurately test the timing parameters of the circuit design, delays introduced by the clock gating and the clock buffering will have to be accounted for during the delay calculation. This is required so that all of the scan flops will clock at about the same time. Unfortunately, a difficulty can arise in determining whether the clock buffering should be performed before or after the gating logic. In many cases, the introduction of clock buffering logic can complicate timing calculations so much that standard analysis tools find it difficult to accurately test data setup and hold times relative to clock. An exemplary commercially available analysis tool is called Sunrise™, and is available from Synopsys, of Mountain View, Calif.

Known prior art designs that find the need for gated clocks, generally utilize external clock gating circuitry. For instance, U.S. Pat. No. 5,598,112, which is hereby incorporated by reference, describes a circuit for generating a demand-based gated clock. As taught therein, an external circuit 50 is used to generate a gated clock to the register 10. The external gating circuitry will therefore have to be accounted for during the timing analysis of the IC design. In some cases, when the external gating logic circuitry grows relatively large, typical software analysis tools will fail to accurately generate a testing result. In such cases, designers are often called upon to perform very time consuming manual delay calculations. For very large designs, manual calculations are not only time consuming, but they can be prone to human error. Any degree of introduced error will therefore have the disadvantage of decreasing the reliability of the testing.

In view of the foregoing, there is a need for scan flop circuitry that enables clock gating, but does not introduce additional external logic that can complicate clock buffering or other automated testing operations.

SUMMARY OF THE INVENTION

Broadly speaking, the present invention fills these needs by providing a scan flop circuit that incorporates internal clock gating capabilities. It should be appreciated that the present invention can be implemented in numerous ways, including as a process, an apparatus, a system, or a device. Several inventive embodiments of the present invention are described below.

In one embodiment, a gated clock scan flop circuit is disclosed. The scan flop includes a data terminal D, a scan input terminal SI, a scan enable terminal SE, a clock terminal CLK, a clock gate terminal G, and an output Q and an inverse output /Q. The scan flop also has internally integrated scan flop circuitry that can be accessed by external logic circuitry by way of the terminals D, SI, SE, CLK, G, Q, and /Q. Preferably, the internally integrated scan flop circuitry includes: (i) a first gate that is configured to receive input connections from both the scan input terminal SI and the clock gate terminal G, (ii) a latch circuit that is configured to receive the clock gate terminal G and track its input while the clock terminal CLK is inactive, (iii) a second gate that is configured to receive input connections from both the scan enable terminal SE and the latch circuit; and (iv) a third gate that is configured to receive input connections from both the clock terminal CLK and an output of the second gate.

In another embodiment, a scan flop circuit is disclosed. The scan flop circuit includes: (a) a sub-scan flop circuit that includes a multiplexer and a flip flop circuit; (b) a data terminal D that is connected to the sub-scan flop circuit; (c) a first logic gate that is configured to receive a scan input terminal SI and a clock gate terminal G, and the first logic gate has a first logic gate output that is connected to the sub-scan flop circuit; (d) a scan enable terminal SE that is connected to the sub-scan flip circuit; (e) a latch circuit that is configured to receive the clock gate terminal G; (f) a second logic gate that is configured to receive the scan enable terminal SE and the latch circuit output, the second logic gate having a second logic gate output; (g) a third logic gate that is configured to receive a clock terminal CLK and the second logic gate output, the third logic gate having a third logic gate output that is connected to the sub-scan flop circuit; and (h) an output Q and a complementary output /Q. In this embodiment, the first logic gate, the latch, the second logic gate, the third logic gate, and the sub-scan flop circuit are internal circuit components of the scan flop circuit.

In still a further embodiment, a method of making a scan flop circuit is disclosed. The method includes: (a) building a sub-scan flop circuit, the sub-scan flop circuit has a multiplexer and a flip flop circuit; (b) defining a data terminal D that is connected to the sub-scan flop circuit; (c) defining a first logic gate that is configured to receive a scan input terminal SI and a clock gate terminal G, the first logic gate having a first logic gate output that is connected to the sub-scan flop circuit; (d) defining a scan enable terminal SE that is connected to the sub-scan flip circuit; (e) defining a latch circuit that is configured to receive the clock gate terminal G; (f) defining a second logic gate that is configured to receive the scan enable terminal SE and the latch circuit output, the second logic gate having a second logic gate output; (g) defining a third logic gate that is configured to receive a clock terminal CLK and the second logic gate output, the third logic gate having a third logic gate output that is connected to the sub-scan flop circuit; and (h) defining an output Q and a complementary output /Q.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a scan flop circuit that incorporates internal clock gating capabilities. It will be obvious, however, to one skilled in the art, that the present invention may be practiced without some or all of these specific details. In other instances, well known process operations have not been described in detail in order not to unnecessarily obscure the present invention.

Figure 1:
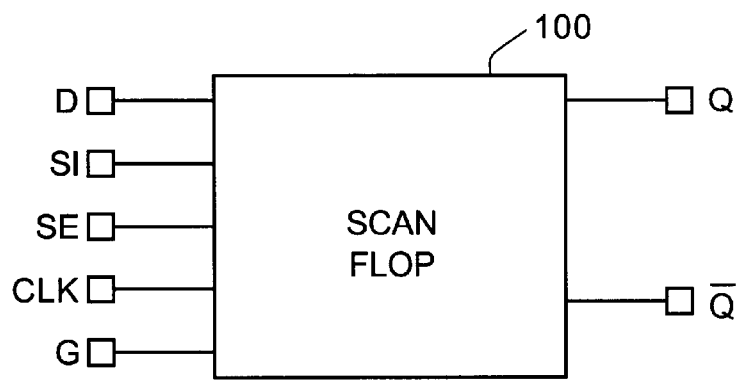
FIG. 1 illustrates a block diagram of a scan flop, in accordance with one embodiment of the present invention.

FIG. 1 illustrates a block diagram of a scan flop 100 in accordance with one embodiment of the present invention. As shown, the scan flop 100 has a data terminal D, a scan input terminal SI, a scan enable terminal SE, a clock terminal CLK, and a clock gate terminal G. The scan flop 100 also includes Q and /Q outputs. To avoid the timing analysis problems of the prior art, the scan flop 100 is integrated as a single logical device. That is, the scan flop 100 is viewed and characterized by automated test tools as a single element, and therefore can be analyzed for proper setup and hold time without requiring separate timing analysis of external gating logic.

In operation, when scan enable SE is set to HI, the clock gate terminal G will be ignored for clock gating purposes. When scan enable SE is set to LOW, the clock gate terminal G can be used for clock gating during normal mode. Thus, in this embodiment, when SE is LOW and the clock gate terminal G is LOW, the clock input will be OFF. Conversely, when SE is LOW and the clock gate terminal G is HI, the clock input will be ON.

Figure 2:
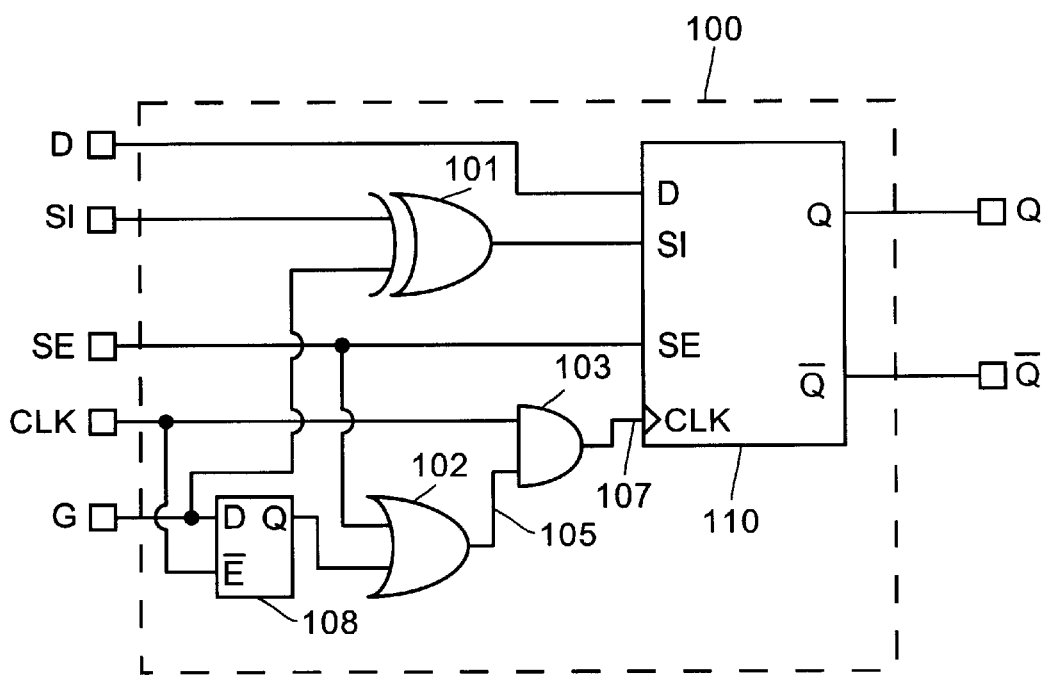
FIG. 2 illustrates a more detailed logic diagram of the scan flop of FIG. 1, in accordance with one embodiment of the present invention.

FIG. 2 illustrates a more detailed logic diagram of the scan flop 100, in accordance with one embodiment of the present invention. Within the scan flop 100 is sub-scan flop 110, which has terminals D, SI, SE, CLK, Q and /Q. The sub-scan flop 110 can include, for example, a multiplexer and a D flip-flop. The data terminal D of the scan flop 100 is connected directly to the sub-scan flop 110. The scan input SI, however, is preferably connected to an input terminal of an XOR gate 101. The other input terminal of the XOR gate 101 is connected to the clock gate terminal G, and the output of the XOR gate 101 leads to the SI terminal of the sub-scan flop 110.

The scan enable SE signal of the scan flop 100 is connected to both the SE terminal of the sub-scan flop 110 and an OR gate 102. A latch circuit 108 is also configured to receive the clock gate terminal G and track its input while the clock terminal CLK is inactive. The OR gate 102 is also configured to receive the latched clock gate terminal G and output a signal 105. The signal 105 then feeds as an input to an AND gate 103. The AND gate 103 also receives the clock signal CLK, and then outputs a gated clock signal 107 to the CLK terminal of the sub-scan flop 110.

When the scan flop 100 operates in scan mode, the scan enable SE signal is HI and the input clock CLK will be passed to the sub-scan flop 110. In more detail, the HI SE signal would be communicated to both the SE terminal of the sub-scan flop 110 and the OR gate 102. Thus, the clock gate terminal G is ignored. However, when the scan flop 100 is operating in normal mode (i.e., non-scan mode), the clock gate terminal G will control when the clock signal CLK is passed to the sub-scan flop 110. The latch 108 prevents changes in the clock gate terminal G while the clock terminal CLK is active, thus preventing glitches in the AND gate 103. To operate in the normal mode, therefore, the scan enable SE signal will be LOW. The LOW signal is thus communicated to both the sub-scan flop 110 and the OR gate 102. Because the LOW signal is being communicated to the OR gate 102, the gated clock G signal can be used to control when the clock signal CLK is passed. More specifically, when SE is LOW and the latched version of G is LOW, the clock CLK is not passed, and when SE is LOW and the latched version of G is HI, the clock CLK is passed.

One of ordinary skill in the art will therefore appreciate that because the scan flop 100 does not require external logic circuitry to complete clock gating, timing relationships and clock buffering can be performed without having to consider time domain altering external gating circuitry. Thus, to well known analysis testing software tools, the scan flop 100 appears as a basic scan flop. Most beneficially, for all cases in which gated clocks are needed, the scan flop 100 can be implemented without having to account for the timing associated with the clock gating circuitry.

Figure 3:
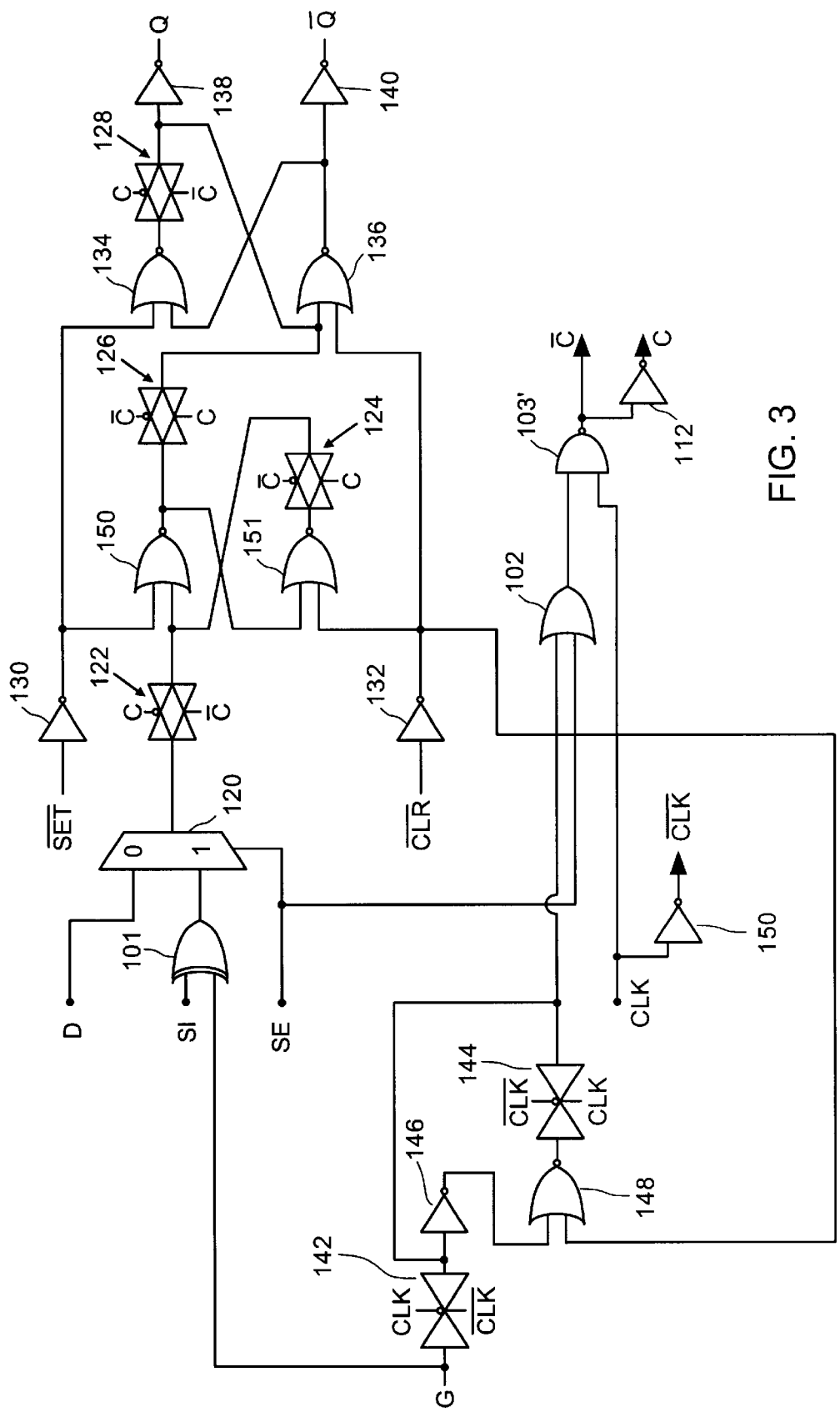
FIG. 3 illustrates another detailed example of the scan flop of FIGS. 1 and 2, in accordance with one embodiment of the present invention.

FIG. 3 illustrates a more detailed example of the scan flop 100, in accordance with one embodiment of the present invention. As shown, the scan flop 100 includes a multiplexer 120 that is configured to receive the data D signal, the output of the XOR 101, and the scan enable SE signal. The XOR 101 is shown connected to the scan input SI and the clock gate terminal G. The output of the multiplexer 120 forms the input data for capture by the flop circuit.

The inverter gate 150 generates a complementary version of the clock signal CLK. The clock terminal G is also connected to the transmission gate 142. The output of the inverter gate 132 and the output of the inverter gate 146 are connected to the inputs of the NOR gate 148 and the output of the inverter gate 148 is connected to the input of the transmission gate 144. The output of the transmission gate 144 is connected to the input of the OR gate 102 and couples back to the output of the transmission gate 142. The transmission gate 144 output thus forms the latched version of the clock gate terminal G.

The transmission gate 142 is shown enabled while the clock terminal CLK is inactive LOW, while the transmission gate 144 is shown enabled when CLK is active HI. This arrangement forms a latch circuit for a positive-edge flop 100. To implement a falling edge flop 100, the enable connections of 142 and 144 would have reversed polarity.

The OR gate 102 will also receive as an input the scan enable terminal SE. The output of the OR gate 102 is connected to the NAND gate 103', which also receives the clock signal CLK. For a positive-edge flop 100, the NAND gate 103' will generate an active LOW control IC and the inverter gate 112 will generate an active HI control signal C. To implement a negative-edge flop 100, the clock signal input to the NAND gate 103' would come from the inverter gate 150, instead of the terminal CLK.

The scan flop 100 also includes a pair of inverters 130 and 132, which respectively receive /SET and /CLR signals. The outputs of the inverters 130 and 132 then respectively couple to cross-coupled NOR gates 150/151 and NOR gates 134/136. The output of the multiplexer 120 leads to a transmission gate 122, and when the transmission gate 122 is enabled, a signal will be communicated to the NOR gate 150 and a transmission gate 124. A transmission gate 126 is also shown connected between the output of NOR gate 150 and the input of NOR gate 136. One input of NOR gate 151 is communicated from the output of inverter 132, and the other input of NOR gate 151 is communicated from the output of NOR gate 150. Therefore, the NOR gate 151 will have an output that is connected to the transmission gate 124.

A transmission gate 128 is also arranged at the output of NOR gate 134. The other side of the transmission gate 128 is coupled to the input of an inverter 138 and the input of NOR gate 136. The output of NOR gate 136 will thus be communicated to the input of NOR gate 134 and an inverter 140. The output of inverter 138 will represent output Q and the output of inverter 140 will represent output /Q.

In one embodiment, gate 101 is configured such that the logical value of G can be observed during scan mode. That is, G and SI are XOR'ed together such that the scan tool can observe what is happening to the G terminal. Advantageously, this provides more fault coverage for scan mode, and therefore better test coverage of the device.

Although a specific model of a gated clock scan flop 100 is provided by way of FIG. 3, it should be understood that any number of scan flop circuit arrangements can be used. An important aspect of the present invention is, however, the use of the gating logic internally to the scan flop 100. By having the gating logic in this internal integrated arrangement, it is possible to use software tools to generate clock buffering logic without the need to account for external clock gating logic.

For more information on scan flop technology and IC testing techniques, reference can be made to co-pending U.S. patent applications: (1) Application No. 09/136,071, entitled "FAST SCAN-FLOP AND INTEGRATED CIRCUIT DEVICE INCORPORATING THE SAME," and filed on Aug. 18, 1998; and (2) Application No. 09/153,634, entitled "BOUNDARY-SCAN CELLS WITH IMPROVED TIMING CHARACTERISTICS," and filed on Sep. 15, 1998. These applications are hereby incorporated herein by reference.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A scan flop circuit, comprising:
   a sub-scan flop circuit, the subscan flop circuit includes a multiplexer and a flip flop circuit;
   a data terminal D being connected to the sub-scan flop circuit;
   a first logic gate being configured to receive a scan input terminal SI and a clock gate terminal G, the first logic gate having a first logic gate output that is connected to the sub-scan flop circuit;
   a scan enable terminal SE being connected to the sub-scan flip circuit;
   a latch circuit being configured to receive the clock gate terminal G;
   a second logic gate being configured to receive the scan enable terminal SE and an output of the latch circuit, the output of the latched circuit being a latched version of the clock gate terminal G, the second logic gate having a second logic gate output;
   a third logic gate being configured to receive a clock terminal CLK and the second logic gate output, the third logic gate having a third logic gate output being connected to the sub-scan flop circuit; and
   an output Q and a complementary output /Q.

2. A scan flop circuit as recited in claim 1, wherein the first logic gate, the second logic gate, the third logic gate, and the sub-scan flop circuit are internal circuit components of the scan flop circuit.

3. A scan flop circuit as recited in claim 2, wherein the scan flop circuit is integrated along with a plurality of external logic circuits, and the external logic circuits connect to the internal circuit components via the data terminal D, the scan input terminal SI, the scan enable terminal SE, the clock terminal CLK, the clock gate terminal G, the output Q, and the complementary output /Q.

4. A scan flop circuit as recited in claim 2, wherein the first logic gate is an XOR gate, the second logic gate is an OR gate, and the third logic gate can be one of an AND gate and a NAND gate.

5. A scan flop circuit as recited in claim 2, wherein the scan enable terminal SE provides a HI when the scan flop circuit is in scan mode.

6. A scan flop circuit as recited in claim 2, wherein the scan enable terminal SE provides a LOW when the scan flop circuit is in normal mode.

7. A scan flop circuit as recited in claim 6, wherein when the scan flop is in normal mode, the clock gate terminal G is be used to switch a clock input to the sub-scan flop circuit to an ON or OFF state.

8. A scan flop circuit as recited in claim 7, wherein when the clock gate terminal G supplies low, the clock input to the sub-scan flop is OFF.

9. A scan flop circuit as recited in claim 7, wherein when the clock gate terminal G supplies high, the clock input to the sub-scan flop is ON.

10. A method of making a scan flop circuit, comprising:
    providing a sub-scan flop circuit, the sub-scan flop circuit includes a multiplexer and a flip flop circuit;
    defining a data terminal D begin connected to the sub-scan flop circuit;
    defining a first logic gate being configured to receive a scan input terminal SI and a clock gate terminal G, the first logic gate having a first logic gate output that is connected to the sub-scan flop circuit;
    defining a scan enable terminal SE being connected to the sub-scan flip circuit;
    defining a latch circuit that is configured to receive the clock gate terminal G;
    defining a second logic gate being configured to receive the scan enable terminal SE and an output of the latch circuit, the output of the latch circuit being a latched version of the clock gate terminal G, the second logic gate having a second logic gate output;
    defining a third logic gate being configured to receive a clock terminal CLK and the second logic gate output, the third logic gate having a third logic gate output being connected to the sub-scan flop circuit, and the latch circuit being configured to be enabled by the clock terminal CLK; and defining an output Q and a complementary output /Q.

11. A scan flop circuit as recited in claim 10, wherein the first logic gate, the second logic gate, the third logic gate, and the sub-scan flop circuit are internal circuit components of the scan flop circuit.

12. A scan flop circuit as recited in claim 10, wherein the scan flop circuit is integrated along with a plurality of external logic circuits, and the external logic circuits connect to the internal circuit components via the data terminal D, the scan input terminal SI, the scan enable terminal SE, the clock terminal CLK, the clock gate terminal G. the output Q. and the complementary output /Q.

13. A scan flop circuit as recited in claim 10, Wherein the first logic gate is an XOR gate, the second logic gate is an OR gate, and the third logic gate can be one of an AND gate and a NAND gate.

14. A scan flop circuit as recited in claim 10, wherein the scan enable terminal SE provides a HI when the scan flop circuit is in scan mode.

15. A scan flop circuit as recited in claim 10, wherein the scan enable terminal SE provides a LOW when the scan flop circuit is in normal mode.

16. A scan flop circuit as recited in claim 15, wherein when the scan flop is in normal mode, the clock gate terminal G is be used to switch a clock input to the sub-scan flop circuit to an ON or OFF state.

* * * * *